(12) United States Patent
Yoon et al.

(10) Patent No.: US 10,312,105 B2
(45) Date of Patent: Jun. 4, 2019

(54) SEMICONDUCTOR DEVICES USING AUXILIARY LAYERS FOR TRIMMING MARGIN AND DEVICES SO FORMED

(71) Applicant: SAMSUNG ELECTRONICS CO., LTD., Suwon-si (KR)

(72) Inventors: Chan-Sic Yoon, Anyang-si (KR); Jiung Pak, Suwon-si (KR); Kiseok Lee, Busan (KR); Chan Ho Park, Incheon (KR); Hyeonok Jung, Daejeon (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 15/598,861

(22) Filed: May 18, 2017

(65) Prior Publication Data

US 2017/0256413 A1    Sep. 7, 2017

Related U.S. Application Data

(63) Continuation of application No. 14/963,368, filed on Dec. 9, 2015, now Pat. No. 9,691,627.

(30) Foreign Application Priority Data

Jan. 14, 2015   (KR) .................... 10-2015-0006915

(51) Int. Cl.
*H01L 21/308* (2006.01)
*H01L 27/108* (2006.01)

(52) U.S. Cl.
CPC ...... *H01L 21/3088* (2013.01); *H01L 21/3086* (2013.01); *H01L 27/10814* (2013.01); *H01L 27/10876* (2013.01)

(58) Field of Classification Search
CPC . H01L 21/3088; H01L 21/3086; H01L 21/20; H01L 21/203; H01L 21/28061;
(Continued)

(56) References Cited

U.S. PATENT DOCUMENTS 7,829,262 B2   11/2010   Tran
8,008,698 B2    8/2011   Lee et al.
(Continued)

FOREIGN PATENT DOCUMENTS

JP   2010161162   7/2010
JP   2011040757   2/2011
(Continued)

*Primary Examiner* — Moazzam Hossain
*Assistant Examiner* — Stanetta Isaac
(74) *Attorney, Agent, or Firm* — Sughrue Mion, PLLC

(57) ABSTRACT

A method of fabricating a semiconductor device includes forming a linear preliminary mask pattern in a first direction on a substrate. The preliminary mask pattern is patterned to provide a plurality of mask patterns that are aligned end-to-end with one another on the substrate and are separated by an exposed portion of the substrate between respective facing ends of the plurality of mask patterns. An auxiliary layer is formed to cover at least sidewalls of the facing ends to reduce a size of the exposed portion to provide a reduced exposed portion of the substrate and the reduced exposed portion of the substrate is etched to form a trench defining active patterns in the substrate aligned end-to-end with one another.

5 Claims, 19 Drawing Sheets

(58) Field of Classification Search
CPC ......... H01L 21/28194; H01L 21/28229; H01L 21/283; H01L 21/30655; H01L 21/31055; H01L 21/31111; H01L 21/31133; H01L 21/32133; H01L 2221/10; H01L 2924/1436; H01L 27/108; G11C 14/0009; G11C 2211/4016
See application file for complete search history.

(56) References Cited

U.S. PATENT DOCUMENTS

| | | |
|---|---|---|
| 8,362,536 B2 | 1/2013 | Chung et al. |
| 2005/0153490 A1 | 7/2005 | Yoon ................. H01L 21/84 438/164 |
| 2010/0170871 A1 | 7/2010 | Sone et al. |
| 2010/0203695 A1 | 8/2010 | Oh ...................... H01L 21/84 438/270 |
| 2011/0039416 A1 | 2/2011 | Cole et al. |
| 2012/0094455 A1 | 4/2012 | Cho et al. |
| 2012/0119181 A1 | 5/2012 | Oh et al. |
| 2013/0307068 A1* | 11/2013 | Kim .................. H01L 27/088 257/334 |
| 2014/0061743 A1* | 3/2014 | Kim .................. H01L 27/088 257/296 |

FOREIGN PATENT DOCUMENTS

| | | |
|---|---|---|
| KR | 20080112281 | 12/2008 |
| KR | 20110060724 | 6/2011 |
| KR | 20110091213 | 8/2011 |
| KR | 20120038209 | 4/2012 |
| KR | 20120052612 | 5/2012 |
| KR | 20140028751 | 3/2014 |

* cited by examiner

SEMICONDUCTOR DEVICES USING AUXILIARY LAYERS FOR TRIMMING MARGIN AND DEVICES SO FORMED

CROSS-REFERENCE TO RELATED APPLICATIONS

This application is a continuation of U.S. patent application Ser. No. 14/963,368, filed Dec. 9, 2015, which claims priority under 35 U.S.C. § 119 to Korean Patent Application No. 10-2015-0006915, filed on Jan. 14, 2015, in the Korean Intellectual Property Office, the entire contents of which are hereby incorporated herein by reference.

FIELD

The inventive concept relates to semiconductor devices and methods of fabricating the same, and in particular, to semiconductor devices with active patterns and methods of fabricating the same.

BACKGROUND

Line widths of patterns in the semiconductor device are generally reduced to increase the density of those devices. There are, however, practical limitations to increasing the design of devices. For example, in the fabrication of DRAM devices, the formation of an active pattern may include the steps of forming a preliminary mask pattern shaped like a line, dividing the preliminary mask pattern into a plurality of mask patterns using a trim process, and then, etching a substrate using the mask patterns as an etch mask to form a trench defining the active patterns.

SUMMARY

According to example embodiments of the inventive concept, a method of fabricating a semiconductor device may include forming mask patterns on a substrate. An auxiliary layer can be formed on the substrate and on sidewalls of the mask patterns. An anisotropic etching can be performed on the auxiliary layer to form auxiliary patterns on sidewalls of the mask patterns, where the auxiliary layer has an etch selectivity with respect to the substrate and the substrate can be etched using the mask patterns and the auxiliary patterns as an etch mask to form a trench defining active patterns.

In example embodiments, a method of fabricating a semiconductor device can include forming a linear preliminary mask pattern in a first direction on a substrate. The preliminary mask pattern can be patterned to provide a plurality of mask patterns that are aligned end-to-end with one another on the substrate and are separated by an exposed portion of the substrate between respective facing ends of the plurality of mask patterns. An auxiliary layer can be formed to cover at least sidewalls of the facing ends to reduce a size of the exposed portion to provide a reduced exposed portion of the substrate and the reduced exposed portion of the substrate can be etched to form a trench defining active patterns in the substrate aligned end-to-end with one another.

A method of fabricating a semiconductor device according to example embodiments can include forming a preliminary mask pattern, having a line shape extending in a direction, on a substrate. The preliminary mask pattern can be patterned to form a plurality of mask patterns that are arranged spaced apart from each other in the direction. An auxiliary layer can be formed on the substrate to conformally cover sidewalls of the mask patterns and a top surface of the substrate. An anisotropic etching process can be performed on the auxiliary layer to provide an exposed portion of the substrate between the mask patterns and the exposed portion of the substrate can be etched to form a trench defining active patterns in the substrate, where a portion of the auxiliary layer remains on the sidewalls of the mask patterns after the anisotropic etching.

A semiconductor device according to example embodiments can include a substrate including a first active pattern and a second active pattern, which are defined by a device isolation layer and are arranged spaced apart from each other in a first direction and a first word line extending in a second direction crossing the first direction and crossing the device isolation layer between the first and second active patterns. When viewed in a plan view, each of the first and second active patterns can be bar-shaped extending in the first direction and has a width in a direction perpendicular to the first direction and a distance between the first and second active patterns in the first direction can be less than the width of each of the first and second active patterns.

BRIEF DESCRIPTION OF THE DRAWINGS

FIGS. 1A through 7A are plan views illustrating a method of fabricating a semiconductor device, according to example embodiments of the inventive concept.

FIGS. 1B through 7B are sectional views taken along line I-I' of FIGS. 1A through 7A, respectively.

FIGS. 1C through 7C are sectional views taken along line II-II' of FIGS. 1A through 7A, respectively.

DETAILED DESCRIPTION

Figure 1A:
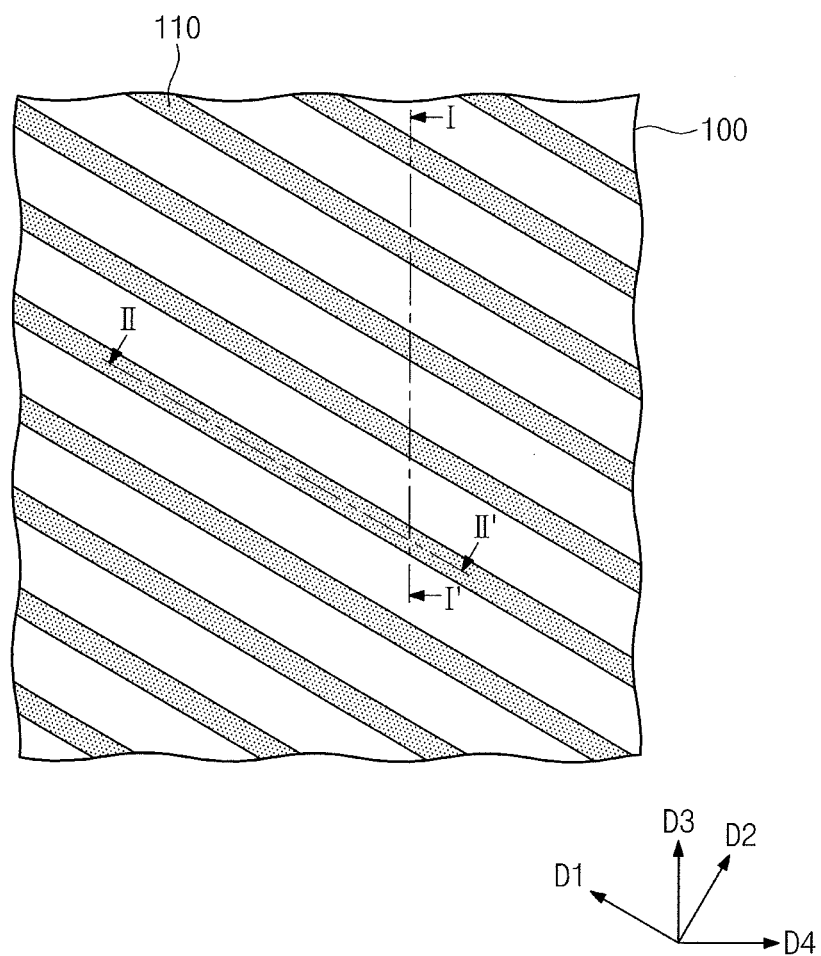

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description may be omitted or not repeated.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1A through 7A are plan views illustrating a method of fabricating a semiconductor device, according to example embodiments of the inventive concept. FIGS. 1B through 7B are sectional views taken along line I-I' of FIGS. 1A through 7A, respectively, and FIGS. 1C through 7C are sectional views taken along line II-II' of FIGS. 1A through 7A, respectively. FIG. 8 is an enlarged view of a portion A of FIG. 7A.

Figure 1B:
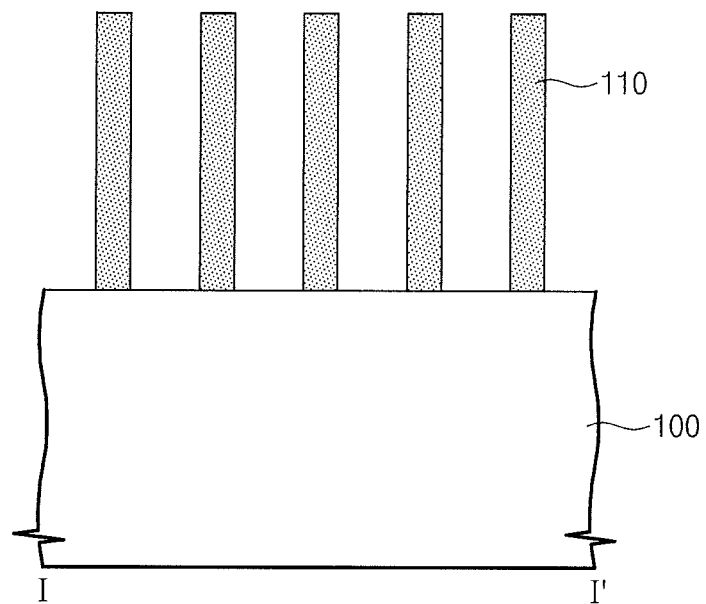
Figure 1C:
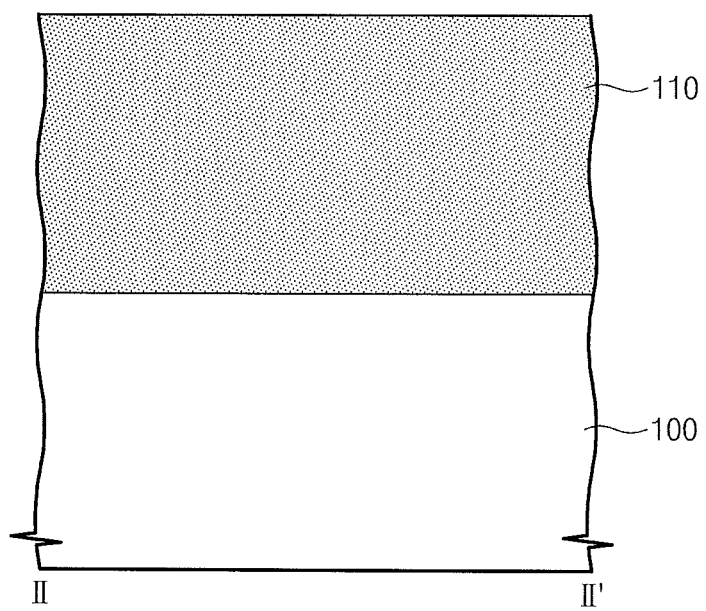

Referring to FIGS. 1A through 1C, preliminary mask patterns 110 may be formed on a substrate 100. The substrate 100 may be a semiconductor substrate such as a silicon wafer, a germanium wafer, or a silicon-germanium wafer or other materials may also be used. Each of the preliminary mask patterns 110 may be a line-shaped pattern extending in a first direction D1 and may be arranged spaced apart from each other in a second direction D2 crossing the first direction D1. The preliminary mask patterns 110 may include a material having an etch selectivity with respect to the substrate 100. As an example, the preliminary mask patterns 110 may include silicon oxide.

Figure 2A:
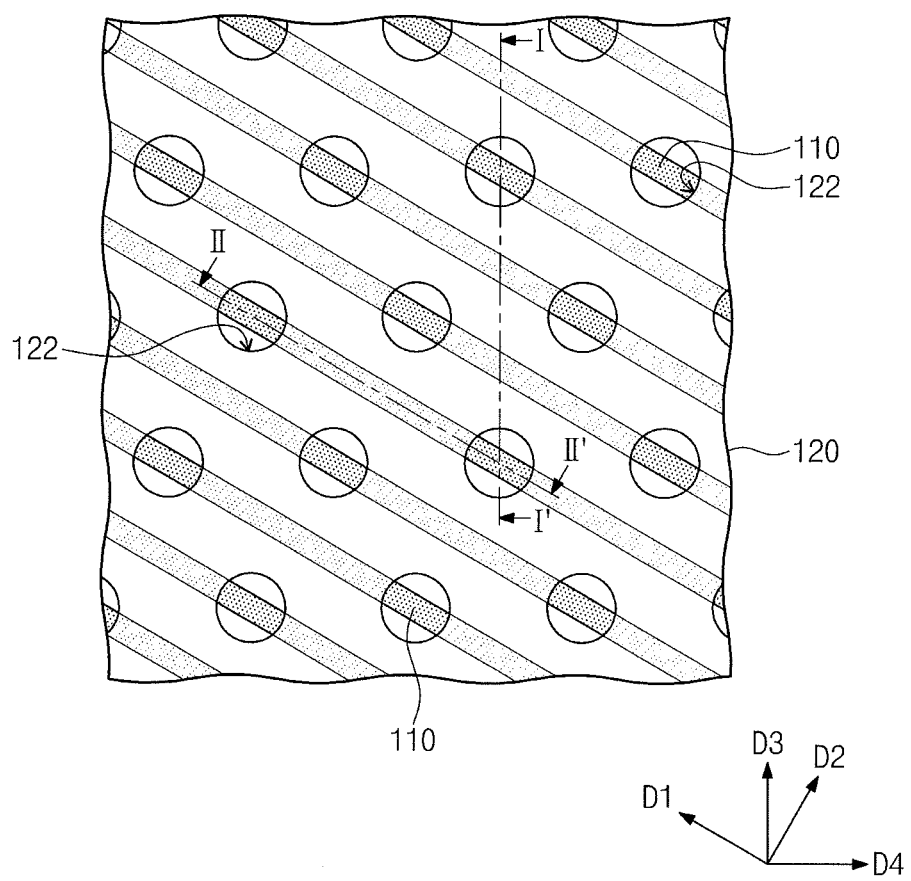
Figure 2B:
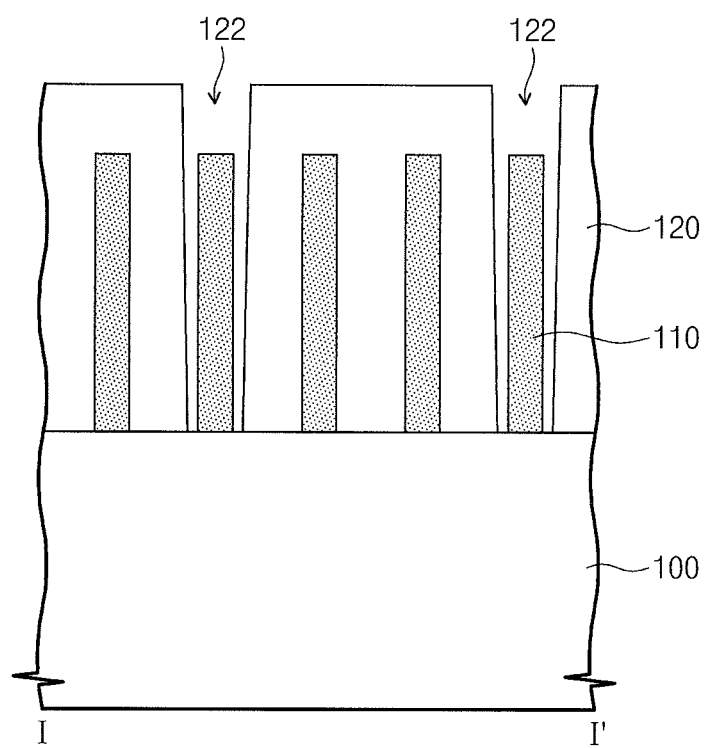
Figure 2C:
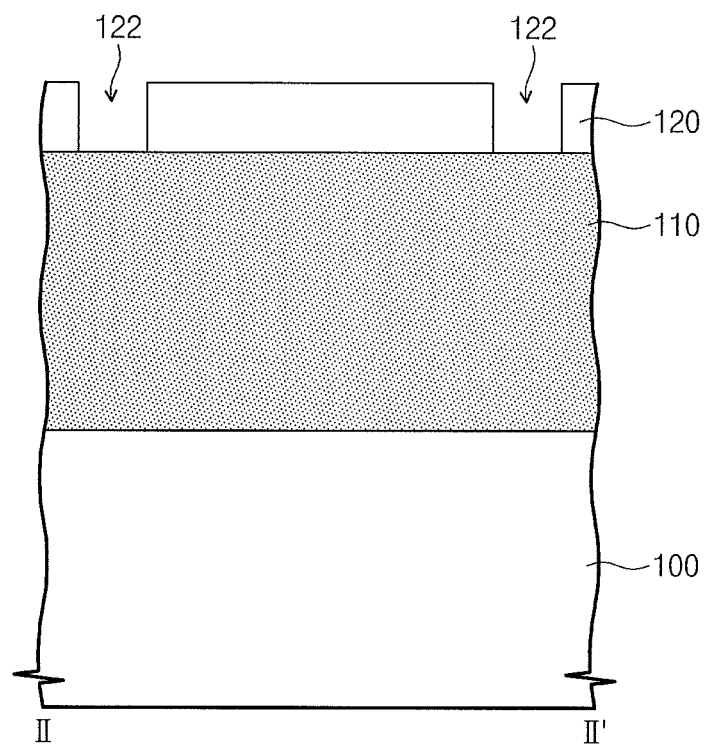

Referring to FIGS. 2A through 2C, a trim mask layer 120 may be formed on the substrate 100 to cover the preliminary mask patterns 110. The trim mask layer 120 may include at least one of spin-on-hardmask (SOH) materials. In some embodiments, the trim mask layer 120 can be any material suitable for a hardmask. The trim mask layer 120 may be formed to have openings 122 exposing particular portions of the preliminary mask patterns 110. When viewed in a plan view, each of the openings 122 may be shaped like a circle, and inner sidewalls 121 of the openings 122 may be overlapped with the preliminary mask patterns 110. Opposite sides of each of the preliminary mask patterns that are exposed by the openings 122 may pass through the inner sidewalls of the opening 122. A plurality of the openings 122 may be formed on each of the preliminary mask patterns 110 to form a row parallel to the first direction D1.

Figure 3A:
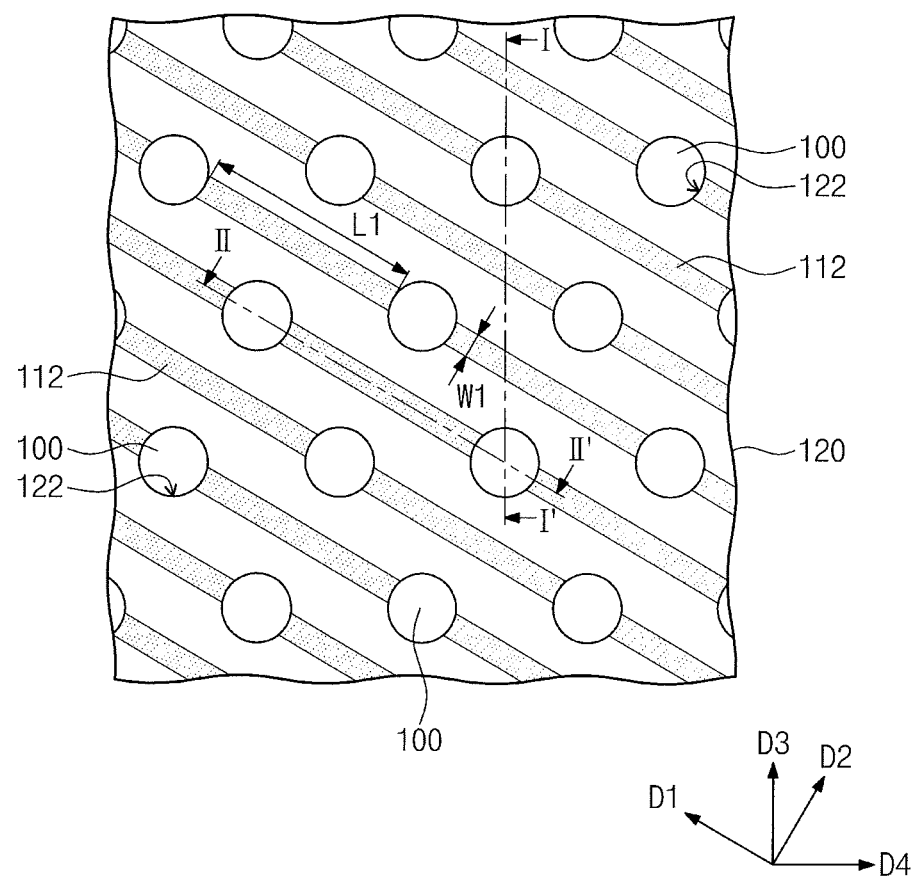
Figure 3B:
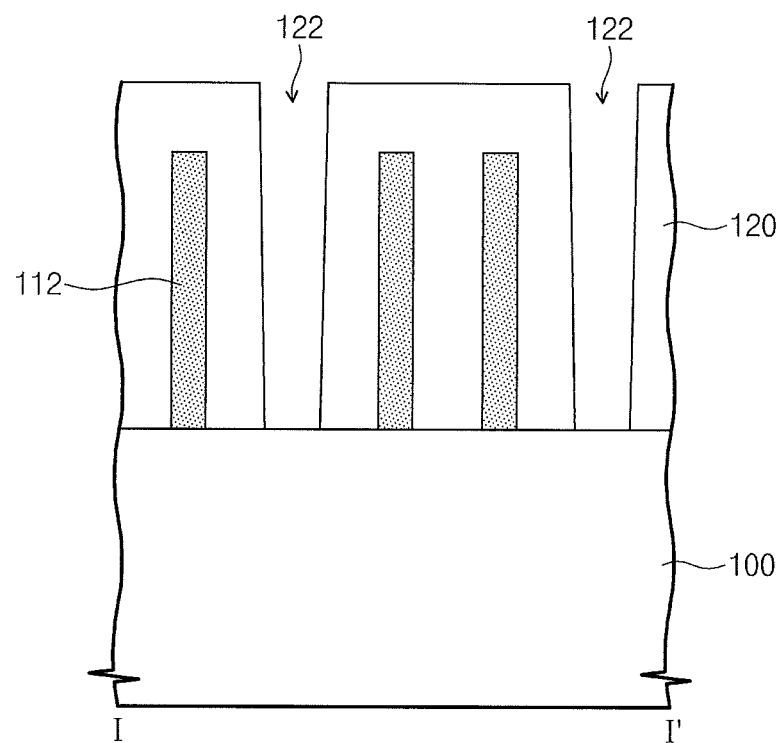
Figure 3C:
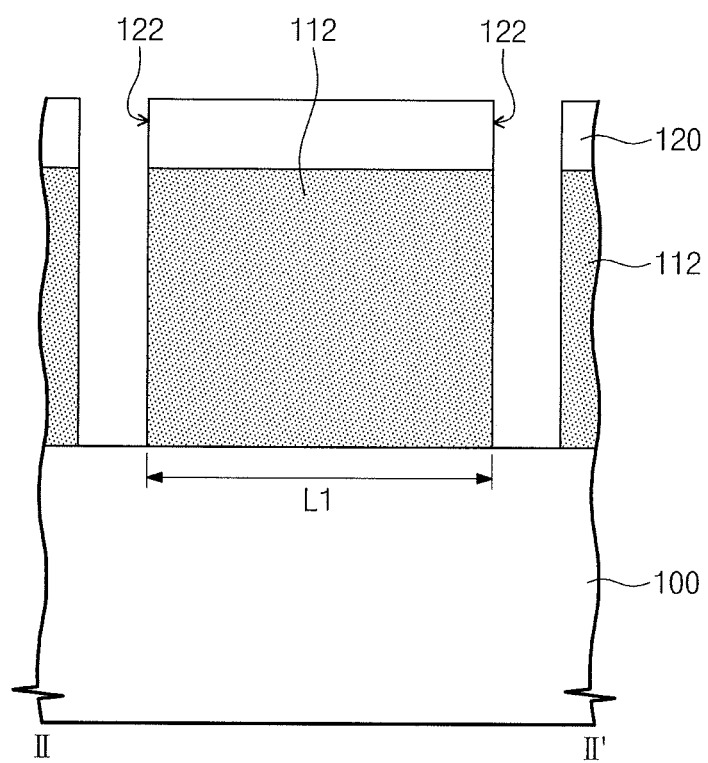

Referring to FIGS. 3A through 3C, the preliminary mask patterns 110 may be etched using the trim mask layer 120 as an etch mask to form mask patterns 112. The portions of the preliminary mask patterns 110 exposed in the openings 122 may be etched by this etching process. For example, as a result of the etching process, each of the preliminary mask patterns 110 may be divided into a plurality of the mask patterns 112. In some embodiments, the portions of the preliminary mask patterns 110 exposed in the openings 122 are removed by the etching so that each of the mask patterns 112 is separated in the D1 direction.

When viewed in a plan view, each of the mask patterns 112 may be shaped like a bar extending parallel to the first direction D1 and may have a longitudinal axis parallel to the first direction D1. When viewed in a plan view, each of the mask patterns 112 may have a first length L1 and a first width W1, which are respectively measured in the first direction D1 and a direction perpendicular thereto (D2). In example embodiments, each of the mask patterns 112 may be formed such that a bottom surface thereof has the first length L1 and the first width W1, where the bottom section is closest to a top surface of the substrate 100.

Figure 4A:
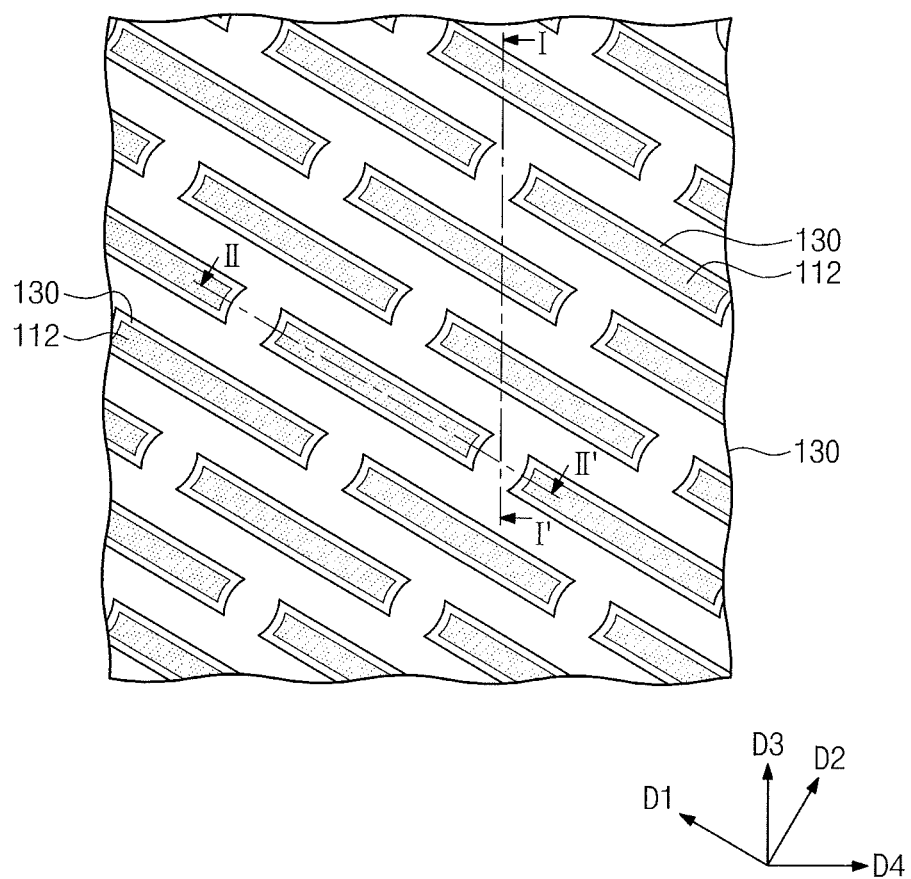
Figure 4B:
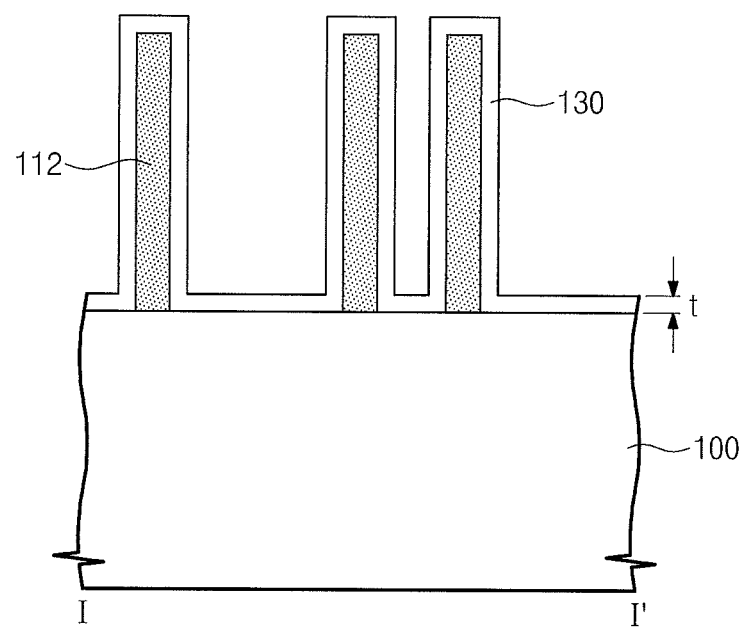
Figure 4C:
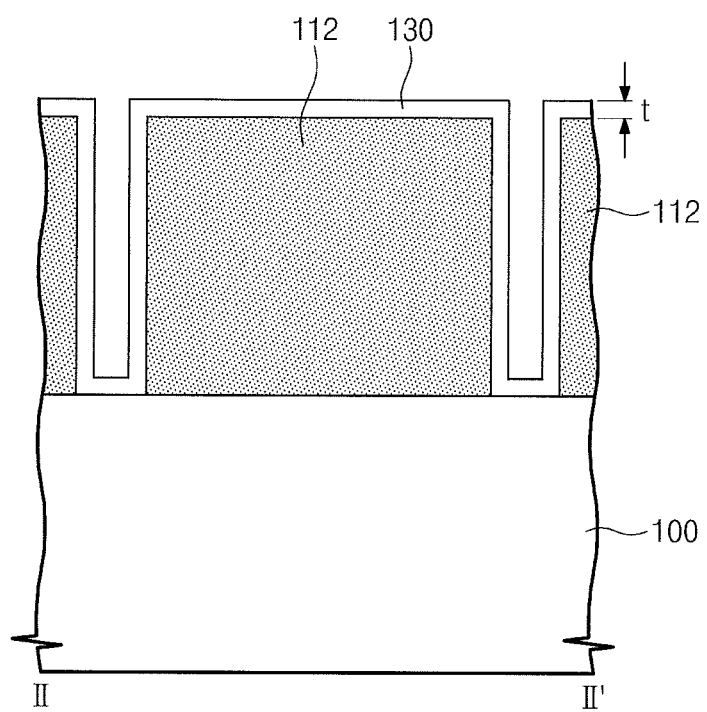

Referring to FIGS. 4A through 4C, the trim mask layer 120 may be removed. As an example, the removal of the trim mask layer 120 may be performed using an ashing and/or strip process. The removal of the trim mask layer 120 may be performed to expose the mask patterns 112 and the top surface of the substrate 100 between the mask patterns 112.

In example embodiments, an auxiliary layer 130 may be formed on the substrate 100 to cover the mask patterns 112. The auxiliary layer 130 may be formed to conformally cover top and side surfaces of the mask patterns 112 and the top surface of the substrate 100 between the mask patterns 112. The auxiliary layer 130 may be formed to have a substantially uniform deposition thickness t, on the top and side surfaces of the mask patterns 112 and the top surface of the substrate 100 between the mask patterns 112. The auxiliary layer 130 may be formed by, for example, an atomic layer deposition process. It will be understood that the auxiliary layer 130 also covers the tops of the mask pattern 112 in FIG. 4A.

The auxiliary layer 130 may include a material having an etch selectivity with respect to the substrate 100. The mask patterns 112 and the auxiliary layer 130 may include the same material. The mask patterns 112 and the auxiliary layer 130 may be formed of or include, for example, silicon oxide. In example embodiments, the mask patterns 112 and the auxiliary layer 130 may be formed of the same material (e.g., silicon oxide).

Figure 5A:
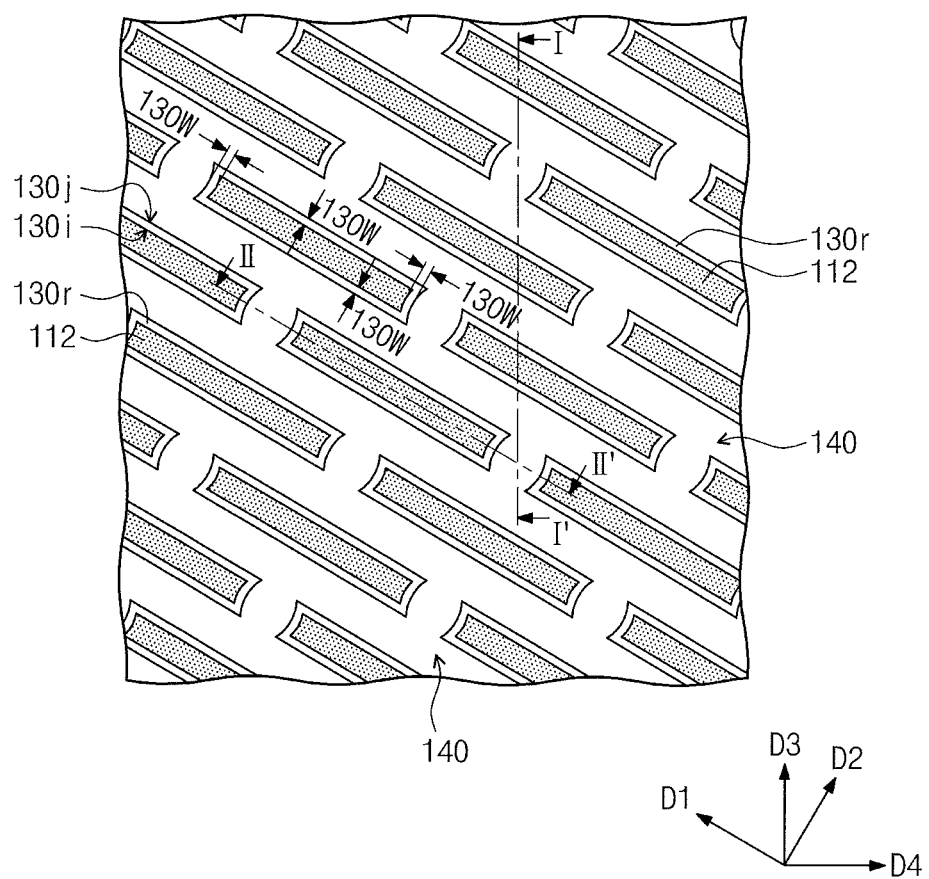
Figure 5B:
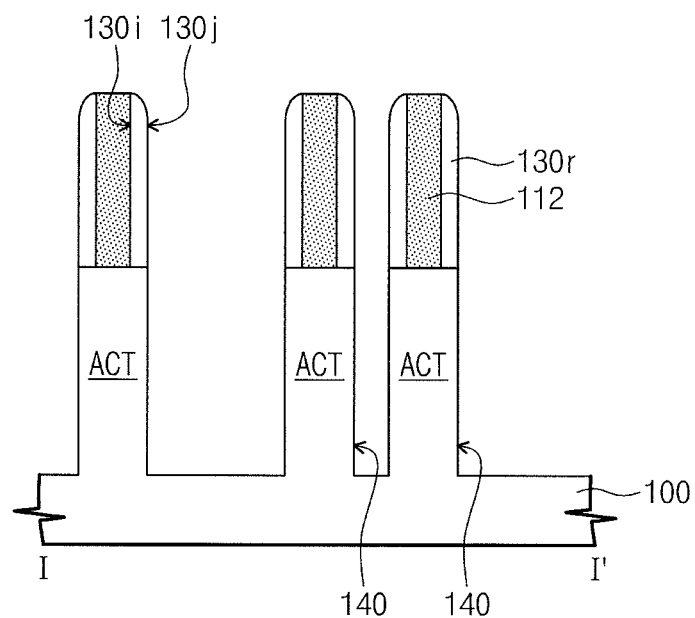
Figure 5C:
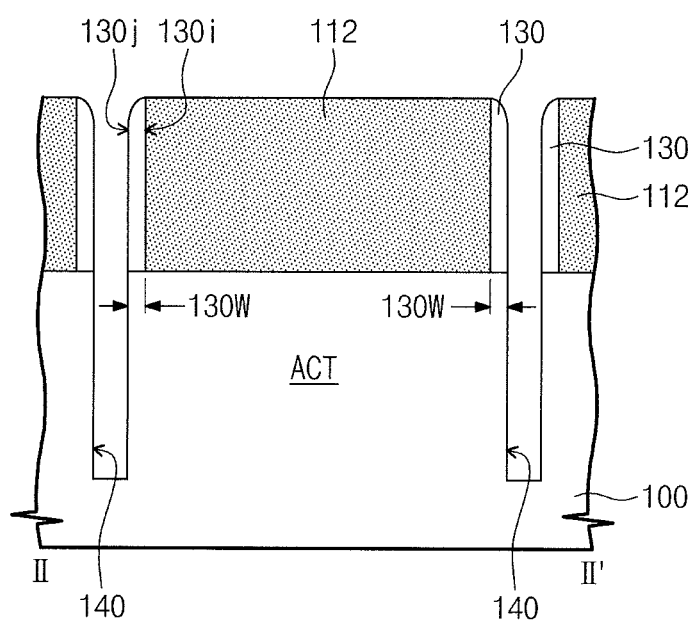

Referring to FIGS. 5A through 5C, an anisotropic etching process may be performed on the resulting structure with the auxiliary layer 130 to remove a portion of the auxiliary layer 130 between the mask patterns 112. Accordingly, the top surface of the substrate 100 between the mask patterns 112 may be exposed. In example embodiments, top surfaces of the mask patterns 112 may be exposed by the anisotropic etching process. After the anisotropic etching process, remains 130r of the auxiliary layer 130 may remain on sidewalls of the mask patterns 112. When viewed in a plan view, the remains 130r of the auxiliary layer 130 may be formed to enclose the sidewalls of each of the mask patterns 112. Hereinafter, the remains 130r of the auxiliary layer 130 remaining on the sidewall of each mask pattern 112 may be called "an auxiliary pattern". In other words, the anisotropic etching process may be performed on the auxiliary layer 130 to form the auxiliary pattern 130r on the sidewall of each of the mask patterns 112 and expose the substrate 100 between the auxiliary patterns 130r.

The auxiliary pattern 130r may be shaped like a ring enclosing a corresponding one of the mask patterns 112, when viewed in a plan view. The auxiliary pattern 130r may have an inner sidewall 130i, which is in contact with the corresponding one of the mask patterns 112, and an outer sidewall 130j, which is positioned opposite to the inner sidewall 130i. As a result of the anisotropic etching process, a width 130W of the auxiliary pattern 130r, which may be defined as the shortest distance between the inner and outer sidewalls 130i and 130j, may be substantially equal to the deposition thickness t of the auxiliary layer 130, when measured at a bottom surface of the auxiliary pattern 130r near the top surface of the substrate 100.

The substrate 100 exposed by the auxiliary patterns 130r may be etched to form a trench 140 defining the active patterns ACT. The formation of the trench 140 may include an etching process, in which the mask patterns 112 and the auxiliary patterns 130r are used as an etch mask. In example embodiments, upper portions of the mask patterns 112 and the auxiliary patterns 130r may also be etched, in the etching process of forming the trench 140.

Figure 6A:
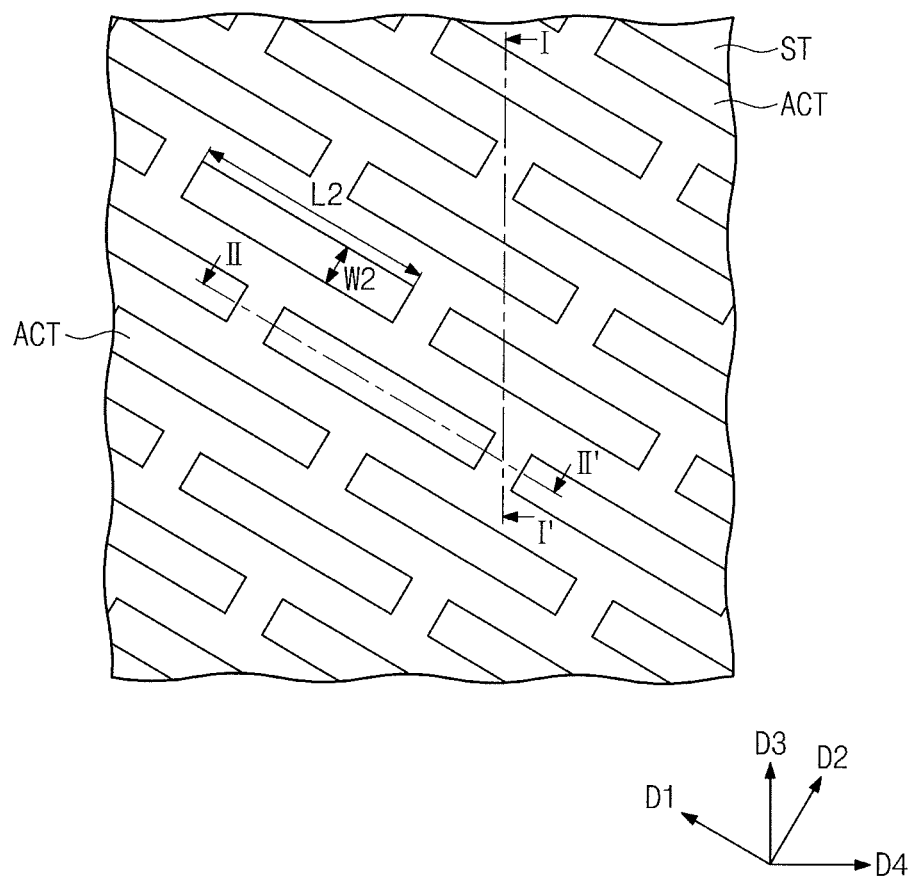
Figure 6B:
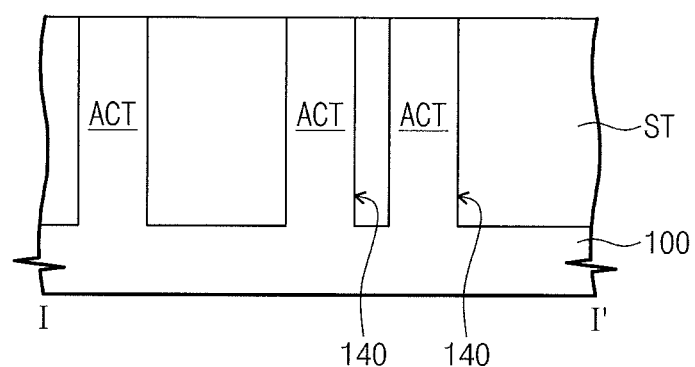
Figure 6C:
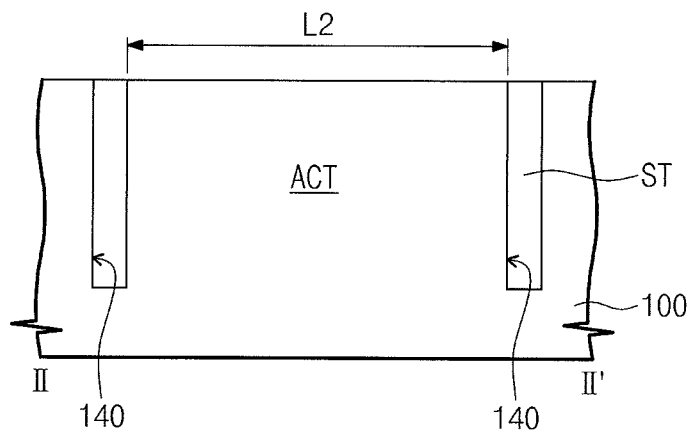

Referring to FIGS. 6A through 6C, a device isolation layer ST may be formed on the substrate 100 to fill the trench 140. The device isolation layer ST may include at least one of oxide (for example, silicon oxide), nitride (for example, silicon nitride), or oxynitride (for example, silicon oxynitride). For example, the formation of the device isolation layer ST may include forming an insulating layer on the substrate 100 to fill the trench 140 and cover the mask patterns 112 and the auxiliary patterns 130r, and then, planarizing the insulating layer to expose the top surface of the substrate 100. Here, the planarization of the insulating layer may be performed to remove the mask patterns 112 and the auxiliary patterns 130r.

When viewed in a plan view, each of the active patterns ACT may be shaped like a bar extending parallel to the first direction D1 and may have a longitudinal axis parallel to the first direction D1. When viewed in a plan view, each of the active patterns ACT may have a second length L2 and a second width W2, which are respectively measured in the first direction D1 and the direction perpendicular thereto. In example embodiments, each of the active patterns ACT may be formed such that a top surface thereof has the second length L2 and the second width W2.

In example embodiments, the first length L1 of each of the mask patterns 112 described with reference to FIG. 3A may be different from the second length L2 of each of the active patterns ACT, and such a difference may be dependent on (e.g., proportional to) the deposition thickness t of the auxiliary layer 130. For example, since the active patterns ACT are formed by the etching process using the mask patterns 112 and the auxiliary patterns 130r as an etch mask, the second length L2 of each of the active patterns ACT may be larger, by about two times the width 130W of each of the auxiliary patterns 130r, than the first length L1 of each of the mask patterns 112. As described above, the width 130W of each of the auxiliary patterns 130r may be substantially equal to the deposition thickness t of the auxiliary layer 130. Similarly, the first width W1 of each of the mask patterns 112 described with reference to FIG. 3A may be different from the second width W2 of each of the active patterns ACT, and such a difference may also be dependent on (e.g., proportional to) the deposition thickness t of the auxiliary layer 130. For example, since the active patterns ACT are formed by the etching process using the mask patterns 112 and the auxiliary patterns 130r as an etch mask, the second width W2 of each of the active patterns ACT may be larger, by about two times the width 130W of each of the auxiliary patterns 130r, than the first width W1 of each of the mask patterns 112. As described above, the width 130W of each of the auxiliary patterns 130r may be substantially equal to the deposition thickness t of the auxiliary layer 130.

As appreciated by the present inventors, an increase in integration density of a semiconductor device may lead to a reduction in contact area between the active patterns ACT and contact plugs, which are provided on the active patterns ACT to connect the active patterns ACT electrically to a capacitor. Accordingly, resistance between the active patterns ACT and the contact plugs may be increase. This means that, as the integration density of the semiconductor device increases, it may be necessary to increase a contact area between the active patterns ACT and the contact plugs.

As further appreciated by the present inventors, in the case where the active patterns ACT are formed by etching the substrate 100, without deposition of the auxiliary layer 130, using the mask patterns 112 as an etch mask, the active patterns ACT may be formed to have shapes copied from the mask patterns 112, thereby having the same length and width (e.g., the first length L1 and the first width W1) as those of the mask patterns 112. That is, the second length L2 and the second width W2 of each of the active patterns ACT may be substantially equal to the first length L1 and the first width W1, respectively. In this case, there may be difficulty in increasing the second length L2 of each of the active patterns ACT, due to optical limitation in an exposure process performed to form the mask patterns 112.

According to example embodiments of the inventive concept, the auxiliary layer 130 may be deposited on the mask patterns 112, and the anisotropic etching process may be performed on the auxiliary layer 130 to form the auxiliary patterns 130r on the sidewalls of the mask patterns 112. Thereafter, the substrate 100 may be etched using the mask patterns 112 and the auxiliary patterns 130r as an etch mask to form the active patterns ACT. In this case, each of the auxiliary patterns 130r may be formed to enclose a corresponding one of the mask patterns 112 and have a ring shape. Accordingly, the second length L2 of each of the active patterns ACT may be greater, by two times the width 130W of each of the auxiliary patterns 130r, than the first length L1 of each of the mask patterns 112. The width 130W of each of the auxiliary patterns 130r may be substantially equal to the deposition thickness t of the auxiliary layer 130. In other words, by using the auxiliary layer 130 with the deposition thickness t, it is possible to increase the second length L2 of each of the active patterns ACT. Further, it is possible to increase a contact area between the active patterns ACT and the contact plugs and thereby to reduce a contact resistance between the active patterns ACT and the contact plugs, and this makes it possible to fabricate a semiconductor device with higher reliability. In some embodiments, additional auxiliary layers 130 can be formed to incrementally add to the second length L2 when more contact area is desired.

Figure 7A:
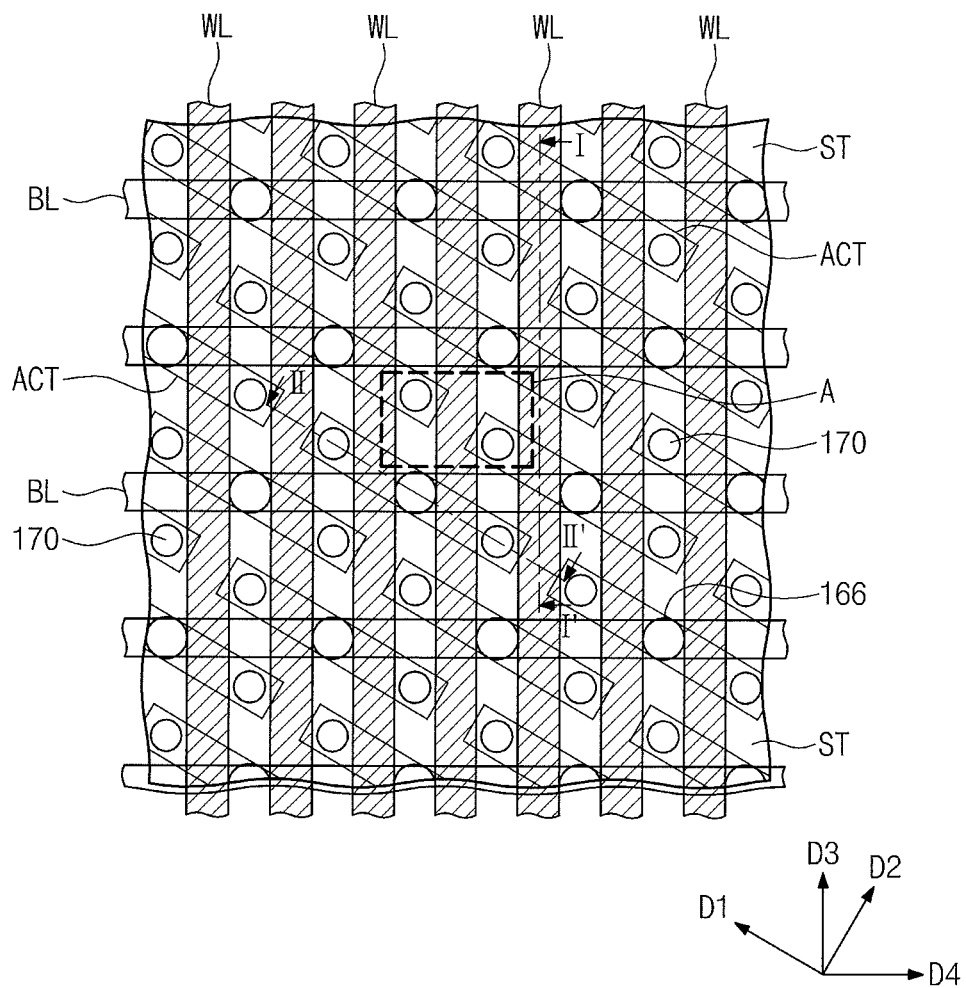
Figure 7B:
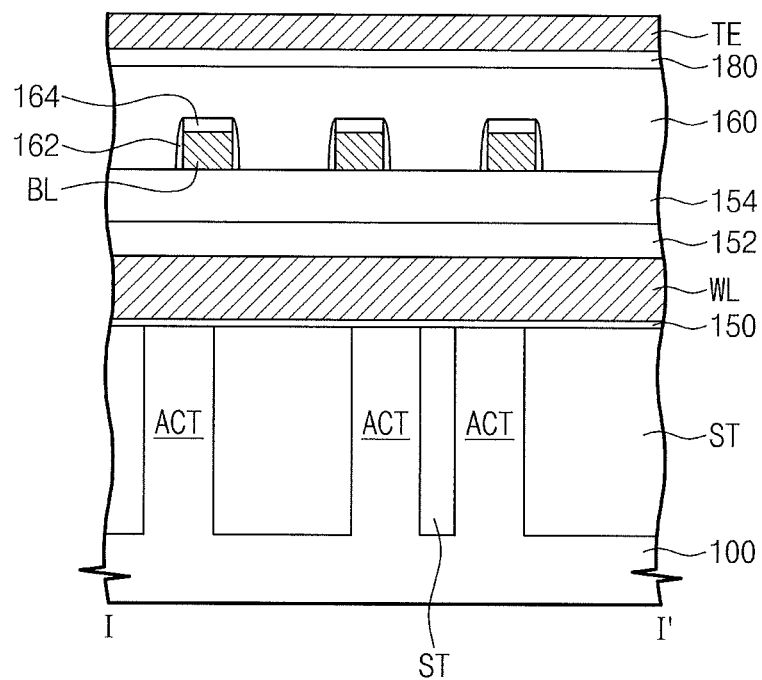
Figure 7C:
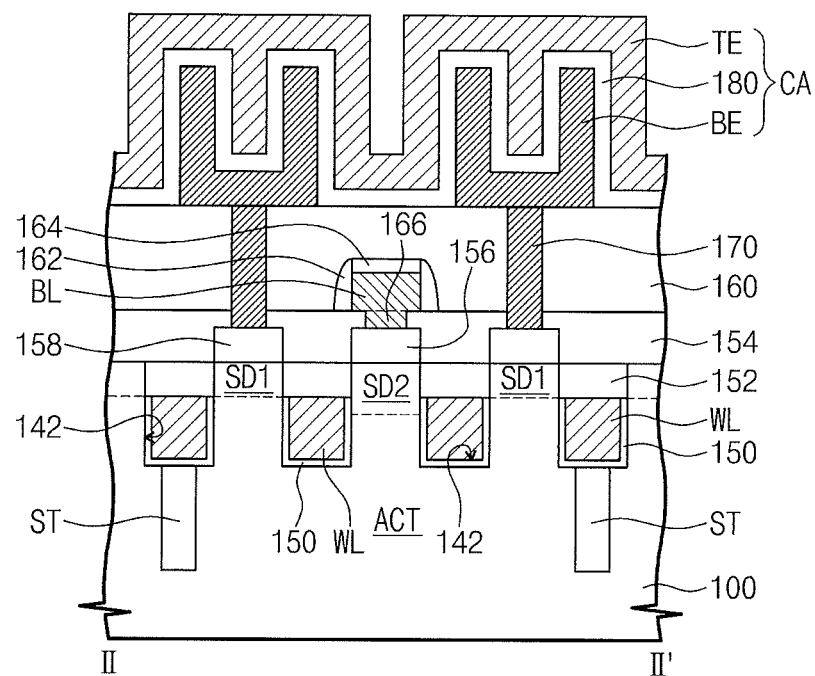
Figure 8:
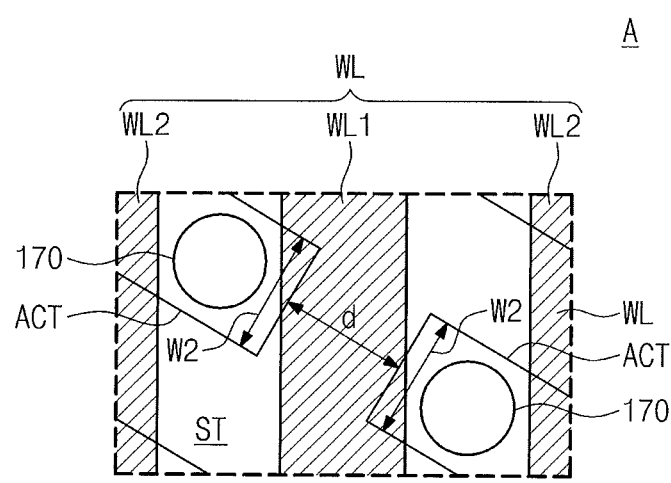
FIG. 8 is an enlarged view of a portion A of FIG. 7A.

Referring to FIGS. 7A through 7C, first doped regions SD1 may be formed in the active patterns ACT. The first doped regions SD1 may be formed by an ion implantation process. As an example, the first doped regions SD1 may be formed to have an n-type conductivity.

The substrate 100 may be patterned to form line-shaped grooves 142 extending in a third direction D3 crossing both of the first and second directions D1 and D2. A gate insulating layer may be formed on the substrate 100 provided with the grooves 142. The gate insulating layer may be formed by a thermal oxidation process, an atomic layer deposition process, or a chemical vapor deposition process. As an example, the gate insulating layer may include a silicon oxide layer. A first conductive layer may be formed on the substrate 100 provided with the gate insulating layer. In example embodiments, the first conductive layer may be formed using a chemical vapor deposition process. The first conductive layer may include a conductive material. For example, the conductive material may be one of doped semiconductor materials (e.g., doped silicon, doped germanium, and so forth), conductive metal nitrides (e.g., titanium nitride, tantalum nitride, and so forth), metals (e.g., tungsten, titanium, tantalum, and so forth), and metal-semiconductor compounds (tungsten silicide, cobalt silicide, titanium silicide, and so forth).

The first conductive layer may be etched to form word lines WL. The etching of the first conductive layer may be performed to form the first conductive layer with a desired thickness, in the grooves 142. The gate insulating layer not covered with the word lines WL may be removed to form gate insulating patterns 150 interposed between the word lines WL and the active patterns ACT and/or between the word lines WL and the device isolation layer ST. In addition, the etching of the first conductive layer may be performed to expose top surfaces of the device isolation layer ST and the active patterns ACT. A first capping layer may be formed on the substrate 100, and a planarization process may be performed on the first capping layer to form first capping patterns 152 in the grooves 142. The first capping patterns 152 may be formed of or include at least one of a silicon nitride layer, a silicon oxide layer, and a silicon oxynitride layer.

Second doped regions SD2 may be formed in the active patterns ACT. The second doped regions SD2 may be formed by an ion implantation process. Each of the second doped regions SD2 may be formed in a corresponding one of the active patterns ACT and may be positioned between a pair of the word lines WL adjacent to each other. As an example, the second doped region SD2 may be formed in the active pattern ACT between the pair of word lines WL, and in this case, the pair of word lines WL may share the second doped region SD2 therebetween. A pair of first doped regions SD1 may be formed in each of the active patterns ACT. The pair of first doped regions SD1 may be spaced apart from each other with the pair of word lines WL interposed therebetween. The second doped regions SD2 may be doped to have the same conductivity type (e.g., n-type) as that of the first doped regions SD1. The second doped regions SD2 may have bottom surfaces positioned at a deeper level than those of the first doped regions SD1.

A doped poly-silicon layer, a doped single crystalline silicon layer, or a conductive layer may be formed on the substrate 100 and then may be patterned to form first pads 158 and second pads 156. The first pads 158 may be connected to the first doped regions SD1, and the second pads 156 may be connected to the second doped regions SD2. If the first and second pads 158 and 156 include the doped polysilicon layer or the single crystalline silicon layer, the first and second pads 158 and 156 may be doped with impurities having the same conductivity type as the first and second doped regions SD1 and SD2.

A first interlayered insulating layer 154 may be formed on the first and second pads 158 and 156. The first interlayered insulating layer 154 may be formed using a chemical vapor deposition process. The first interlayered insulating layer 154 may include a silicon oxide layer, a silicon nitride layer, and/or a silicon oxynitride layer. A portion of the first interlayered insulating layer 154 may be patterned to form contact holes, in which direct contacts 166 will be formed.

A second conductive layer may be formed on the first interlayered insulating layer 154. The second conductive layer may be formed to fill the contact holes. For example, the second conductive layer may include a conductive material (e.g., metals and/or doped semiconductor materials). A second capping layer may be formed on the second conductive layer. For example, the second capping layer may include at least one of a silicon nitride layer, a silicon oxide layer, or a silicon oxynitride layer. The second capping layer and the second conductive layer may be patterned to form bit lines BL and second capping patterns 164 thereon. The bit lines BL may extend in a fourth direction D4 crossing the first to third direction D1, D2, and D3 and may be spaced apart from each other in the third direction D3.

Direct contacts 166 may be formed in the contact holes, respectively. The direct contacts 166 may connect the bit lines BL electrically to the active patterns ACT. An insulating spacer layer may be conformally deposited on the first interlayered insulating layer 154 and may be anisotropically etched to form insulating spacers 162 covering both sidewalls of each of the bit lines BL. The insulating spacers 162 may include at least one of a silicon nitride layer, a silicon oxide layer, or a silicon oxynitride layer.

A second interlayered insulating layer 160 may be formed on the first interlayered insulating layer 154 to cover the bit lines BL. The second interlayered insulating layer 160 may be formed using, for example, a chemical vapor deposition process. The second interlayered insulating layer 160 may include at least one of a silicon oxide layer, a silicon nitride layer, or a silicon oxynitride layer.

Buried contacts 170 may be formed to penetrate the second interlayered insulating layer 160 and the first interlayered insulating layer 154 and may be connected to the active patterns ACT. The buried contacts 170 may include a conductive material such as doped silicon or metals. For example, the buried contacts 170 may be connected to the active patterns ACT through the first pads 158, and the direct contacts 166 may be connected to the active patterns ACT through the second pads 156.

Lower electrodes BE may be formed on the second interlayered insulating layer 160 and may be connected to the buried contacts 170, respectively. Each of the lower electrodes BE may be formed to have a bottom-closed cylindrical shape. Thereafter, a capacitor CA may be formed by forming a dielectric layer 180 to conformally cover the lower electrodes BE and forming an upper electrode TE to cover the lower electrodes BE in common. The lower electrodes BE and the upper electrode TE may be formed of or include at least one of, for example, doped silicon, metals, or metal compounds. The dielectric layer 180 may be formed of or include at least one of metal oxides (e.g., $HfO_2$, $ZrO_2$, $Al_2O_3$, $La_2O_3$, $Ta_2O_3$, and $TiO_2$), perovskite dielectric materials (e.g., STO ($SrTiO_3$), BST (($Ba,Sr$)$TiO_3$), $BaTiO_3$, PZT, and PLZT) and may be provided in a single- or multi-layered structure.

Structural features of a semiconductor device fabricated by the method according to example embodiments of the inventive concept will be described with reference to FIGS. 7A through 7C and FIG. 8.

Referring to FIGS. 7A through 7C and FIG. 8, the device isolation layer ST may be provided on the substrate 100 to define the active patterns ACT.

When viewed in a plan view, each of the active patterns ACT may be shaped like a bar and may be disposed to have a longitudinal axis parallel to the first direction D1. Each of the active patterns ACT may have the second width W2, when measured in a direction perpendicular to the first direction D1. In example embodiments, a distance d between a pair of active patterns ACT adjacent to each other in the first direction D1 may be smaller than the second width W2. Here, the distance d between the pair of active patterns ACT may be a distance measured in the first direction D1.

The word lines WL may be provided in the substrate 100. The word lines WL may extend parallel to the third direction D3 and may be spaced apart from each other in the fourth direction D4. The word lines WL may be buried in the substrate 100 or be provided in the form of a buried gate line. The gate insulating patterns 150 may be interposed between the word lines WL and the active patterns ACT, and the gate insulating patterns 150 may be interposed between the word lines WL and the device isolation layer ST. The first capping patterns 152 may be provided on the word lines WL. The first capping patterns 152 may have top surfaces that are substantially coplanar with that of the substrate 100. As an example, the first capping patterns 152 may have bottom surfaces in contact with the top surfaces of the gate insulating patterns 150 and both side surfaces in contact with the active patterns ACT and/or the device isolation layer ST. As another example, the gate insulating patterns 150 may extend between the first capping patterns 152 and the active patterns ACT and/or between the first capping patterns 152 and the device isolation layer ST.

In example embodiments, as shown in FIG. 8, the word lines WL may include a first word line WL1, which is disposed to cross the device isolation layer ST between the pair of active patterns ACT. When viewed in a plan view, at least one of the pair of active patterns ACT may be partially overlapped with the first word line WL1.

The first and second doped regions SD1 and SD2 may be provided in the active patterns ACT. As an example, a pair of the first doped regions SD1 and the second doped region SD2 therebetween may be provided in each active pattern ACT. In detail, the second doped region SD2 may be formed in a portion of the active pattern ACT, which is positioned between an adjacent pair of the word lines WL, and may be shared by the pair of the word lines WL. The pair of the first doped regions SD1 may be formed in portions of the active pattern ACT, which are positioned outside the pair of word lines WL, and may be spaced apart from each other with the pair of the word lines WL interposed therebetween. In example embodiments, the second doped region SD2 may be extended into the substrate 100 to have a greater depth than that of the first doped region SD1. In other example embodiments, the first doped region SD1 may be formed to have substantially the same depth as that of the second doped region SD2. The first and second doped regions SD1 and SD2 may have a different conductivity type from the substrate 100. For example, in the case where the substrate 100 is of a P-type, the first and second doped regions SD1 and SD2 are of an N-type.

The first pads 158 and the second pads 156 may be provided on the substrate 100, and here, the first pads 158 may be respectively connected to the first doped regions SD1 and the second pads 156 may be respectively connected to the second doped regions SD2. The first interlayered insulating layer 154 may be provided on the substrate 100 to cover the first and second pads 158 and 156.

The bit lines BL may be provided on the first interlayered insulating layer 154. The bit lines BL may extend parallel to the fourth direction D4 and may be spaced apart from each other in the third direction D3. The bit lines BL may be connected to the direct contacts 166 penetrating the first interlayered insulating layer 154. In this case, the direct contacts 166 may be connected to the active patterns ACT through the second pads 156. The second capping patterns 164 may be provided on the bit lines BL, and the insulating spacers 162 may be provided to cover both sidewalls of each of the bit lines BL. The second interlayered insulating layer 160 may be provided on the first interlayered insulating layer 154 to cover the bit lines BL, the second capping patterns 164, and the insulating spacers 162.

The buried contacts 170 may be provided on the substrate 100 to penetrate the first and second interlayered insulating layers 154 and 160 and may be connected to the active patterns ACT. In this case, the buried contacts 170 may be connected to the active patterns ACT through the first pads 158.

As shown in FIG. 8, the word lines WL may further include a second word line WL2 crossing one of the pair of active patterns ACT. In this case, the buried contact 170 connected to one of the pair of active patterns ACT may be provided on a portion of the active pattern ACT, which is positioned between the first and second word lines WL1 and WL2.

According to example embodiments of the inventive concept, the distance d between the pair of active patterns ACT may be smaller than the second width W2 of each of the active patterns ACT. Further, when viewed in a plan view, at least one of the pair of active patterns ACT may be partially overlapped with the first word line WL1. Accordingly, it is possible to increase a contact area between the active patterns ACT and the buried contacts 170 connected thereto and thereby to reduce a contact resistance therebetween.

Memory elements may be provided on the second interlayered insulating layer 160 to be connected to the buried contacts 170, respectively. As an example, the capacitor CA may be provided as the memory elements. The capacitor CA may include the lower electrodes BE, which are respectively connected to the buried contacts 170, the upper electrode TE covering the lower electrodes BE, and the dielectric layer 180 interposed between the lower electrodes BE and the upper electrode TE. Each of the lower electrodes BE may be shaped like a bottom-closed cylinder. The upper electrode TE may be a common electrode covering at least one or all of the lower electrodes BE.

According to example embodiments of the inventive concept, mask patterns may be formed on a substrate, and an auxiliary layer may be formed to cover the mask patterns. An anisotropic etching process may be performed on the auxiliary layer to form auxiliary patterns on sidewalls of the mask patterns. Thereafter, the substrate may be etched using the mask patterns and the auxiliary patterns as an etch mask to form active patterns. Each of the auxiliary patterns may be shaped like a ring enclosing a corresponding one of the mask patterns. As a result of the use of the auxiliary patterns, each of the active patterns may be formed to have a second length which is larger, by two times a width of each of the auxiliary patterns, than a first length of each of each of the mask patterns. Here, the width of each auxiliary pattern may be substantially equal to a deposition thickness of the auxiliary layer. To sum up, by using the auxiliary layer with such a deposition thickness, it is possible to increase a length of each active pattern (i.e., the second length). In some embodiments, the width of the active patterns can also be increased by the formation of the auxiliary layer. This makes it possible to increase effectively contact area between the active patterns and contact plugs thereon and consequently to reduce a contact resistance therebetween, and thus, a semiconductor device with improved reliability can be fabricated.

Figure 9:
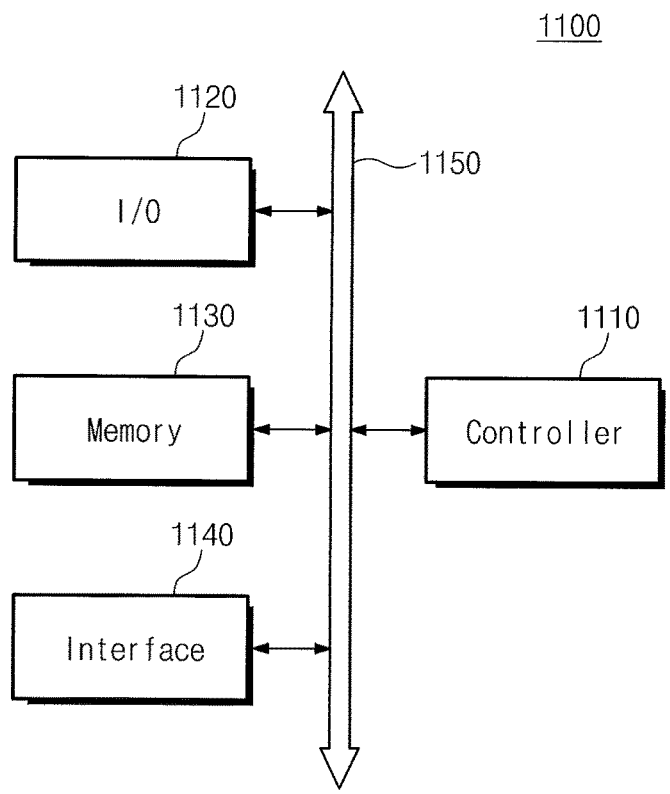
FIG. 9 is a block diagram illustrating an example of electronic systems including a semiconductor device according to example embodiments of the inventive concept.

FIG. 9 is a block diagram illustrating an example of electronic systems including a semiconductor device according to example embodiments of the inventive concept.

Referring to FIG. 9, an electronic system 1100 according to example embodiments of the inventive concept may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or other similar logic devices. The I/O unit 1120 may include a keypad, a keyboard and/or a display unit. The memory device 1130 may store data and/or commands. The memory device 1130 may include at least one semiconductor device according to the embodiments described above. The memory device 1130 may further include other types of semiconductor memory devices, which are different from the semiconductor devices described above. The interface unit 1140 may transmit electrical data to a communication network or may receive electrical data from a communication network.

The electronic system 1100 may be applied to a laptop computer, a personal digital assistant (PDA), a portable computer, a web tablet, a wireless phone, a mobile phone, a digital music player, a memory card, or an electronic product.

Figure 10:
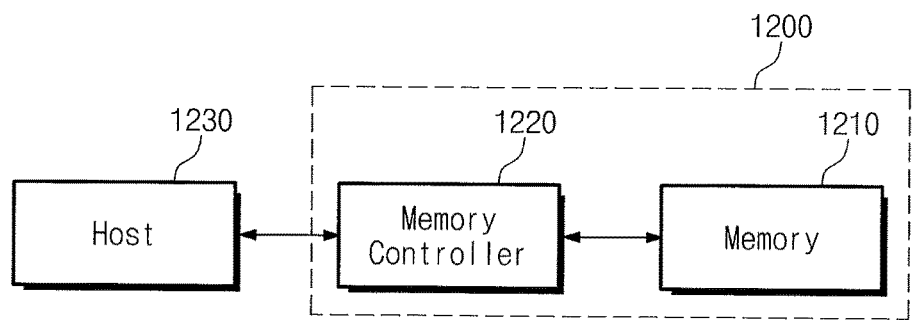
FIG. 10 is a block diagram illustrating an example of memory cards including a semiconductor device according to example embodiments of the inventive concept.

FIG. 10 is a block diagram illustrating an example of memory cards including a semiconductor device according to example embodiments of the inventive concept.

Referring to FIG. 10, a memory card 1200 may include a memory device 1210. The memory device 1210 may include at least one semiconductor device according to the afore-described embodiments of the inventive concept. In some embodiments, the memory device 1210 may further include a semiconductor memory device, which is of a different type from the semiconductor memory devices according to the afore-described embodiments of the inventive concept. The memory card 1200 may include a memory controller 1220 that controls data communication between a host 1230 and the memory device 1210.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
a substrate comprising a first active pattern and a second active pattern, which are defined by a device isolation layer and are arranged spaced apart from each other in a first direction; and
a first word line extending in a second direction crossing the first direction and crossing the device isolation layer between the first and second active patterns,
wherein, when viewed in a plan view, each of the first and second active patterns is bar-shaped extending in the first direction and has a width extending in a third direction perpendicular to the first direction and crossing the second direction, and at least one of the first and second active patterns is partially overlapped with the first word line, and
wherein a distance between the first and second active patterns in the first direction is less than the width of each of the first and second active patterns.

2. The semiconductor device of claim 1, further comprising:
a second word line extending in the second direction and crossing the first active pattern;
a capacitor connected to the first active pattern; and
a first contact plug vertically positioned between the first active pattern and the capacitor,
wherein the first contact plug is provided on the first active pattern between the first and second word lines.

3. The semiconductor device of claim 2, further comprising:
a bit line extending in a fourth direction crossing the first and second directions; and
a second contact plug vertically positioned between the first active pattern and the bit line, wherein the second contact plug is provided on the first active pattern positioned at a side of the second word line and is spaced apart from the first contact plug with the second word line therebetween.

4. The semiconductor-device of claim 3, wherein the first word line is buried in the device isolation layer between the first and second active patterns, and
wherein the second word line is buried in the first active pattern.

5. The semiconductor device of claim 3, further comprising a first doped region and a second doped region in the first active pattern and positioned on both sides of the second word line,
wherein the capacitor is electrically connected to the first doped region by the first contact plug, and
wherein the bit line is electrically connected to the second doped region by the second contact plug.

* * * * *